(12) United States Patent
Nichol et al.

(10) Patent No.: US 11,183,390 B2
(45) Date of Patent: Nov. 23, 2021

(54) METHOD OF ENHANCING A DLC COATED SURFACE FOR ENHANCED MULTIPACTION RESISTANCE

(71) Applicant: Nokomis, Inc., Charleroi, PA (US)

(72) Inventors: Robert Michael Nichol, Washington, PA (US); Walter John Keller, III, Bridgeville, PA (US); Todd Eric Chornenky, Carmichaels, PA (US)

(73) Assignee: NOKOMIS, INC., Charleroi, PA (US)

( * ) Notice: Subject to any disclaimer, the term of this patent is extended or adjusted under 35 U.S.C. 154(b) by 0 days.

(21) Appl. No.: 16/103,519

(22) Filed: Aug. 14, 2018

(65) Prior Publication Data

US 2019/0181013 A1    Jun. 13, 2019

Related U.S. Application Data

(60) Provisional application No. 62/605,511, filed on Aug. 15, 2017.

(51) Int. Cl.

| H01L 21/3065 | (2006.01) |
| H01L 21/02 | (2006.01) |
| H01J 9/12 | (2006.01) |
| H01J 1/32 | (2006.01) |
| C23C 16/27 | (2006.01) |
| C23C 16/02 | (2006.01) |

(52) U.S. Cl.
CPC .......... *H01L 21/3065* (2013.01); *H01J 1/32* (2013.01); *H01J 9/125* (2013.01); *H01L 21/02019* (2013.01); *H01L 21/02043* (2013.01); *H01L 21/02376* (2013.01); *C23C 16/0245* (2013.01); *C23C 16/0281* (2013.01); *C23C 16/276* (2013.01)

(58) Field of Classification Search
CPC .......... H01L 21/0234; H01L 21/30604; H01L 21/3065; H01L 21/30655; H01L 21/31053; H01L 21/31055; H01L 21/311; H01L 21/31105; H01L 21/31111; H01L 21/31116; H01L 21/31127; H01L 21/31133; H01L 21/31138; H01L 21/3213; H01L 21/32133; H01L 21/32135; H01L 21/32136; H01L 21/47573

See application file for complete search history.

(56) References Cited

U.S. PATENT DOCUMENTS

| 5,989,693 | A | * | 11/1999 | Yamasaki | ........... | C03C 17/3435 |
| | | | | | | 359/580 |
| 2002/0024011 | A1 | * | 2/2002 | Shimizu | ................. | B82Y 10/00 |
| | | | | | | 430/5 |
| 2005/0058836 | A1 | * | 3/2005 | Goldstein | ............. | B08B 7/0092 |
| | | | | | | 428/411.1 |
| 2006/0280946 | A1 | * | 12/2006 | Cooper | ................. | C23C 28/343 |
| | | | | | | 428/408 |

(Continued)

*Primary Examiner* — Thomas T Pham
(74) *Attorney, Agent, or Firm* — AP Patents; Alexander Pokot

(57) ABSTRACT

A method for creating an enhanced multipaction resistant diamond-like coating (DLC) coating with lower Secondary Electron Emission (SEE) properties is performed on an initial surface by etching a DLC coating deposited on the surface after deposition and optionally creating interlayers to enhance adhesion mechanical properties between the DLC coating and the initial surface.

24 Claims, 3 Drawing Sheets

(56) References Cited

U.S. PATENT DOCUMENTS

| | | | | |
|---|---|---|---|---|
| 2009/0121208 A1* | 5/2009 | Nagashima | ............ | H01L 27/101 |
| | | | | 257/2 |
| 2009/0197404 A1* | 8/2009 | Yang | ................ | H01L 21/02063 |
| | | | | 438/652 |
| 2010/0047519 A1* | 2/2010 | Lee | .................... | H01L 21/0262 |
| | | | | 428/141 |
| 2011/0143976 A1* | 6/2011 | Ito | ....................... | C23C 14/0036 |
| | | | | 508/109 |
| 2013/0196177 A1* | 8/2013 | Nagata | .................. | G11B 5/725 |
| | | | | 428/835.2 |
| 2015/0017468 A1* | 1/2015 | Lukitsch | ............. | C23C 14/0605 |
| | | | | 428/627 |
| 2015/0132539 A1* | 5/2015 | Bailey | ................ | C23C 16/0254 |
| | | | | 428/141 |
| 2016/0333186 A1* | 11/2016 | Liu | ......................... | C09D 1/00 |

* cited by examiner

METHOD OF ENHANCING A DLC COATED SURFACE FOR ENHANCED MULTIPACTION RESISTANCE

CROSS REFERENCE TO RELATED APPLICATIONS

This application claims the benefit of priority from U.S. Provisional Patent Application Ser. No. 62/605,511, filed Aug. 15, 2017, entitled "METHOD FOR CREATING AN ENHANCED DIAMOND-LIKE CARBON COATING ON A MULTIPACTION PRONE SURFACE OF A COMPONENT", which is incorporated by reference herein in its entirety.

STATEMENT REGARDING FEDERALLY SPONSORED RESEARCH OR DEVELOPMENT

This invention was made with federal support under U.S. Department of Energy Phase II Grant No. DE-SC0013878. The Government has certain rights to this invention.

REFERENCE TO SEQUENCE LISTING, A TABLE, OR A COMPUTER PROGRAM LISTING COMPACT DISC APPENDIX

N/A

BACKGROUND OF INVENTION

The present invention relates to enhancing diamond-like coating (DLC) carbon based multipaction resistant coatings used in components having multipactor inhibiting coatings for use in any circumstances where the phenomenon of multipactor flashover occurs. For example, such components may be provided to high power RF energy devices, such as plasma sources, microwave devices, particle accelerating devices that generate high power, low frequency energy corresponding to radio frequency, microwave, or millimeter wavelengths, and that require an isolated vacuum environment in order to operate. These components may be components of klystrons, Inductive Output Tubes (IOTs), linear accelerators, magnetrons, RF amplifiers, UHF television transmitters, Traveling Wave Tube Amplifiers (TWTAs or TWTs), particle accelerators, triodes, radiotherapy devices, Free Electron Lasers (FELs), Backward Wave Oscillators (BWOs), ion accelerators, plasma devices, relativistic diffraction generators, RF transmitters, satellite systems, RF communication equipment, multipactors, or other high power energy devices that generate, propagate, or disperse energy corresponding to radio frequency, microwave, or millimeter wavelengths. These coated components may also be used in circumstances where the phenomenon of multipactor flashover does not occur but where it is desirable to selectively transmit electromagnetic energy at some frequencies while blocking or inhibiting transmission of other frequencies.

Multipactor flashover is a phenomenon that occurs in high power RF energy devices, wherein secondary electrons interact with a time-varying electric field to produce exponential secondary electron multiplication resulting in an avalanche of electrons that damages or destroys components of the high power RF energy devices. The cause of this phenomenon involves high second electron emission (SEE) coefficients of the surfaces of the components that are exposed to the high power RF energy in the vacuum environment.

Waveguides of high power RF energy devices are components that may suffer from multipactor flashover. Common materials used in these waveguides include copper, silver, gold, and ALODINE, and high power devices commonly utilize oxygen-free copper with silver or gold plating. These materials are well-suited for waveguide applications based on RF response, but these materials share a major drawback: an unacceptably high SEE coefficient resulting in multipactor flashover events at relatively low field strengths. Diplexer components in satellite RF devices are a bottleneck due to their high rates of multipactor failure and, therefore, decrease overall performance. Recent research to address this problem includes simulation methodologies, new component test procedures, surface geometry modifications, and new processing techniques for multipactor mitigation coatings and other materials.

RF windows are components that also may suffer from multipactor flashover. Alumina is conventionally used for these RF windows. However, as a standalone material, alumina has an unacceptably high SEE coefficient resulting in multipactor flashover events at relatively low power. One conventional option for improving the SEE coefficient of alumina RF windows is to coat the RF window with titanium nitride (TiN), which has a lower SEE coefficient than alumina. It is therefore unsuitable for many applications such as space applications. Moreover, even if chemical exposure of the TiN coating is prevented, the improvement resulting from the TiN coating is limited. For a thin TiN coating there is a danger of a multipactor flashover. A thick TiN coating will inhibit multipactor flashover, but it fails due to overheating as a result of RF absorption. Recent research to address those deficiencies has focused on modeling the multipactor effect, optimizing the structure of the alumina dielectric, improving the processing of the TiN coatings, and replacing TiN with alternative materials.

Also, AQUADAG, a water-based colloidal graphite suspension that was patented in the 1970s has been used for coatings in applications such as cathode ray tubes, and there has been some research in terms of publications and patents relating to DLC coatings for these applications.

Therefore, a variety of carbon-based multipactor resistant coatings has been developed or is in use. However, carefully prepared DLC have shown improvement in RF window properties.

SUMMARY OF THE INVENTION

An enhanced multipactor-inhibiting carbon nanofilm using a gas and especially a noble-gas etching technique, wherein a SEE coefficient of the enhanced multipactor inhibiting carbon nanofilm invention detailed herein is less than a SEE coefficient of the same carbon nanofilm without the use of the noble-gas etching technique. Argon is one exemplary cost-effective noble gas which may be used. The enhanced filter thus offers multipaction mitigation enhancement.

A thickness of the enhanced multipactor inhibiting carbon nanofilm may typically be between 0.142 nm and 200 nm thick.

The enhanced multipactor inhibiting carbon nanofilm includes DLC. DLC includes a plurality of parallel sp$^2$ and sp$^3$ hybridized carbon sheets.

The surface of the component may be a metal surface. The metal may be formed of copper, silver, aluminum, or gold, or which may be copper plated with silver or gold.

Components

The component may be a waveguide comprising at least one surface defining at least one cavity through which high power RF energy is guided, wherein the enhanced multipactor-inhibiting carbon nanofilm covers the at least one surface of the waveguide.

The coated component may be a waveguide having at least one enhanced multipactor-inhibiting carbon nanofilm coated surface defining at least one cavity, wherein the method further comprises the steps of exposing the multipactor-inhibiting carbon nanofilm coated surface of the waveguide to the vacuum environment and passing high power RF energy through the cavity. The apparatus may be a klystron, an inductive output tube, a linear accelerator, an RF amplifier, a UHF television transmitter, a particle accelerator, a radiotherapy device, an ion accelerator, a plasma device, an RF transmitter, RF communication equipment or a high power RF device.

The component may be a waveguide having a cavity for guiding high power RF energy from the high power RF energy source therethrough, wherein a surface of the waveguide defining the cavity has the enhanced multipactor-inhibiting carbon nanofilm thereon. The waveguide may be attached to a diplexer or an output multiplexer.

Surfaces

The surface of the component may be formed of a ceramic material. The ceramic material may include a metal oxide material. The metal oxide material may be alumina, such as single crystalline sapphire or polycrystalline alumina.

The ceramic material may include a metal nitride material, such as aluminum nitride. The ceramic material may include a carbide compound, such as silicon carbide.

The component may be an RF window comprising a microwave transparent material for separating a vacuum environment and a surrounding environment, wherein the enhanced multipactor-inhibiting carbon nanofilm covers at least the surface of the microwave transparent material facing the vacuum environment.

An RF window for high power RF energy devices of the present invention includes a microwave transparent material for separating a vacuum environment and a surrounding environment, and an enhanced multipactor-inhibiting carbon nanofilm covering at least the surface of the microwave transparent material that faces the vacuum environment, wherein a SEE coefficient of the enhanced multipactor inhibiting carbon nanofilm is less than a SEE coefficient of the unenhanced multipactor inhibiting carbon nanofilm on the microwave transparent material.

The enhanced multipactor inhibiting carbon nanofilm may be one or more intermediate layers between the microwave transparent material and the enhanced multipactor inhibiting carbon nanofilm. The one or more intermediate layers may include a ceramic material, such as a metal nitride or a carbide compound, or silicon. The metal nitride may be AlN. The carbide compound may be SiC.

The intermediate layers serve the purpose of enhancing the adhesive or attachment strength between layers and/or enhancing multipaction mitigation properties.

A waveguide for a high power RF energy device of the present invention includes at least one surface defining at least one cavity through which high power RF energy is guided, and an enhanced multipactor-inhibiting carbon nanofilm covering the at least one surface of the waveguide, wherein a SEE coefficient of the enhanced multipactor inhibiting carbon nanofilm is less than a SEE coefficient of the at least one surface of the waveguide coated with unenhanced multipactor inhibiting carbon nanofilm.

A first intermediate layer may be formed by growing the first intermediate layer on the surface of the component. The first intermediate layer may be grown by at least one of molecular beam epitaxy and pulsed laser deposition.

A second intermediate layer may be formed to cover a surface of the first intermediate layer before the multipactor-inhibiting carbon nanofilm is formed. The second intermediate layer may be a ceramic material, such as a carbide compound. The carbide compound may be silicon carbide. The second intermediate layer may be formed by growing the second intermediate layer on the first intermediate layer. The second intermediate layer may be grown by at least one of chemical vapor deposition and metalorganic vapor phase epitaxy.

The step of forming the enhanced multipactor-inhibiting carbon nanofilm may include transforming at least a portion of the second intermediate layer into the multipactor-inhibiting carbon nanofilm.

The step of growing the enhanced multipactor-inhibiting carbon nanofilm may include depositing the multipactor inhibiting carbon nanofilm by electron beam induced deposition (EBID). Another method may be PVD, PECVD, or a hybrid PVD/PECVD process.

The component may be a waveguide comprising at least one surface defining at least one cavity through which high power RF energy is guided, wherein the enhanced multipactor-inhibiting carbon nanofilm covers the at least one surface of the waveguide.

The component may be an RF window comprising a microwave transparent material for separating a vacuum environment and a surrounding environment, wherein the enhanced multipactor-inhibiting carbon nanofilm covers at least the surface of the microwave transparent material facing the vacuum environment.

A method of using an enhanced multipactor-inhibiting carbon nanofilm coated high power RF energy device component includes exposing a multipaction inhibiting carbon nanofilm coated surface of the component to a vacuum environment and exposing the enhanced multipaction inhibiting carbon nanofilm coated surface of the component to high power RF energy in the vacuum environment.

The coated component may be an RF window, and wherein the method further comprises the steps of separating the vacuum environment from a surrounding environment using the RF window and passing high power RF energy through the RF window. The RF window may be provided to a klystron, an inductive output tube, a linear accelerator, an RF amplifier, a UHF television transmitter, a particle accelerator, a radiotherapy device, an ion accelerator, a plasma device, an RF transmitter, RF communication equipment or a high power RF device.

A component of the present invention that is exposed to a plasma environment includes an enhanced multipactor-inhibiting carbon nanofilm covering at least one surface of the component. The component may be a component in at least one of an RF, microwave, millimeter wave, generating device. The component may be installed in at least one of the following: a plasma generated RF source, a plasma generated microwave source, or a plasma generated millimeter source. The enhanced carbon nanofilm coating may be employed to provide enhanced reliability of the component.

A RF window utilizing the present invention might consist of a plate of material transparent to electromagnetic energy across one band and an enhanced multipactor-inhibiting carbon nanofilm layer on at least one surface of the plate in a thickness so as to reduce the transmission of electromagnetic energy through the RF window at another band.

A multilayer RF window of the present invention includes a material transparent to electromagnetic energy across one band, an enhanced multipactor-inhibiting carbon nanofilm layer disposed on at least one of the surfaces of said material in a thickness so as to reduce the transmission of electromagnetic energy through the RF window at a second band, and a third layer that inhibits the transmission of electromagnetic energy across a third band.

OBJECTS OF THE INVENTION

It is, therefore, one of the primary objects of the present invention to provide a method for reducing the SEE of a surface by means of a DLC coating.

Another object of the present invention is the reduction of the SEE by means of a DLC coating to a value below 1.00.

A further object of the present invention is to provide a means to protect the coating after it has been created.

Yet a further object of the present invention is to provide a system for preparing a surface to be coated with DLC based multipaction resistant coating.

An additional object of the present invention is to enhance the adhesion of the DLC coating to the substrate it is over.

Another object of the present invention is to provide a method for cleaning the surface in preparation for DLC coating.

A further object of the present invention is to provide a method storing a cleaned surface before coating it with DLC.

A further object of the present invention is to provide a method for enhancing the material properties such as strength of the DLC coating.

A further object of the present invention is to provide a method of maintaining the DLC coating's protective coating in a solid state which is comprised of maintaining it in a state of evaporative equilibrium.

In addition to the several objects and advantages of the present invention which have been described with some degree of specificity above, various other objects and advantages of the invention will become more readily apparent to those persons who are skilled in the relevant art, particularly, when such description is taken in conjunction with the attached drawing Figures and with the appended claims.

DETAILED DESCRIPTION OF THE INVENTION

Figure 1:
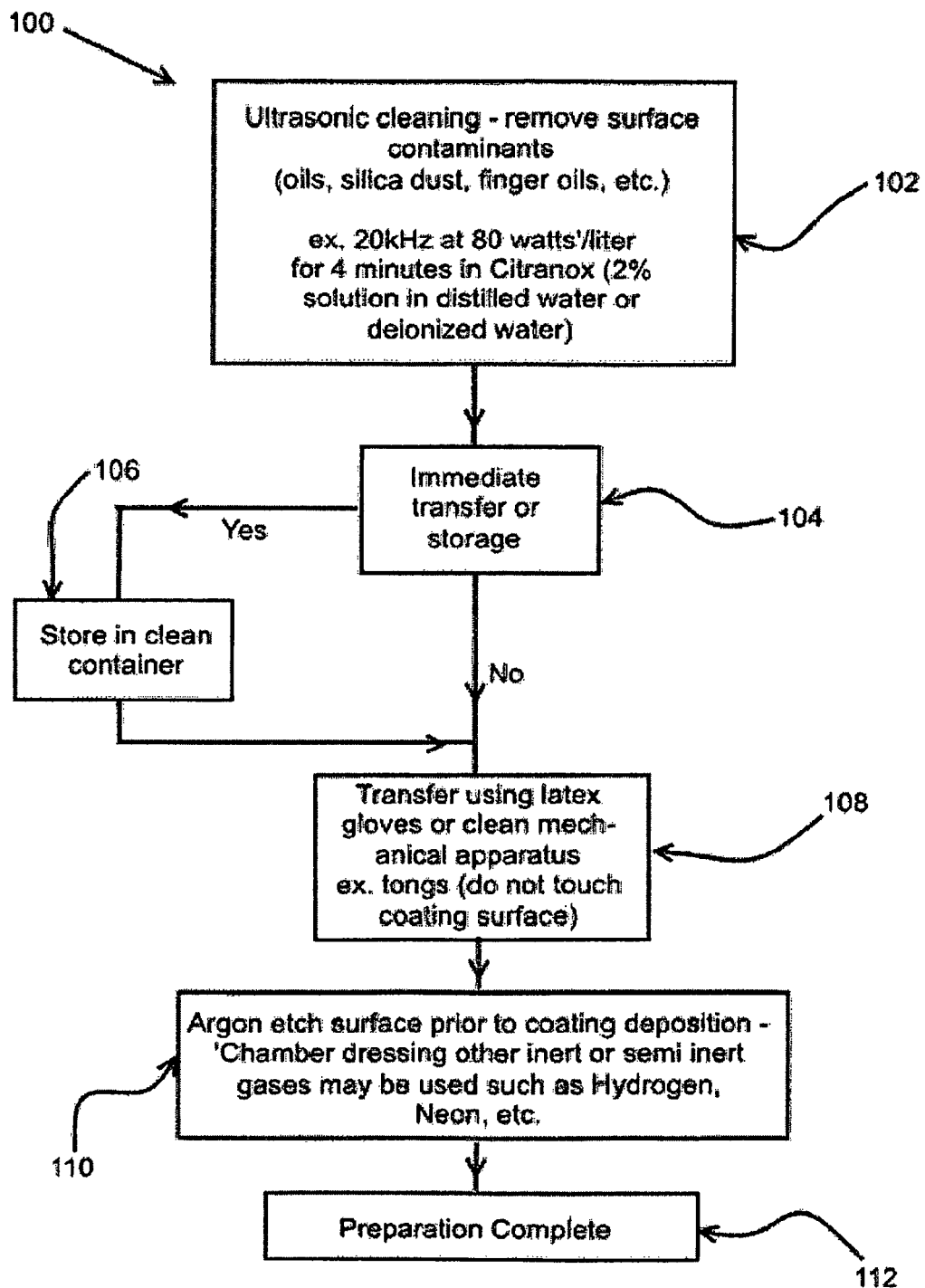
FIG. 1 is a flowchart of surface preparation steps for preparing a component to be coated with an enhanced multipaction resistant coating.

Prior to proceeding to the more detailed description of the present invention, it should be noted that, for the sake of clarity and understanding, identical components which have identical functions have been identified with identical reference numerals throughout the several views illustrated in the drawing figures.

FIG. 1 and Flowchart 100 illustrate a flowchart of surface preparation steps for preparing a component to be coated with an enhanced multipaction resistant coating. In step 102, an optional ultrasonic cleaning process will begin that will remove surface contaminants such as finger oils, oils, silica dust, etc. The ultrasound cleans the surface of macro contaminants and oils causes their substantial removal, mechanically removing surface contaminants, finger oil, silica dust, manufacturing oils, and manufacturing residues. The ultrasound cleaned device is now typically ready for step 104.

In step 104, the decision is made to be store the component in a cleaned container or immediately transfer it for the next step in the preparation process. If storage is chosen in step 104, in step 106, the component should optionally be stored in a clean container until it can be transferred.

In step 108, the component must then be transferred into the etching/deposition chamber using latex gloves or using a clean mechanical apparatus such as tongs, pliers, or a bolt-able attachment transfer assembly, and attaching to surfaces not affected by multipaction such as the outsides of waveguides so that contact with the coating surface is avoided. During this transfer step it is best to minimize touching and use gloves with typically pre-cleaning gloves in alcohol before handling.
Especially avoid touching surfaces prone to multipaction, as an example, a device transfer fixture In step 110, the device is Argon etched, or etched with another suitable gas such as a different noble gas or chemically active gas or inactive gas to remove surface contaminants. A Chamber dressing or pre-etch liquid precursor may be used before Argon etching the device.

The Etch removes Oxygen, oxidation, the pre-etch results in enhanced adhesion. The Etch in the deposition system is to better control environment. This is considered Pre-deposition etching.

In step 112, preparation for the components enhanced multipaction resistant coating is considered complete.

Figure 2:
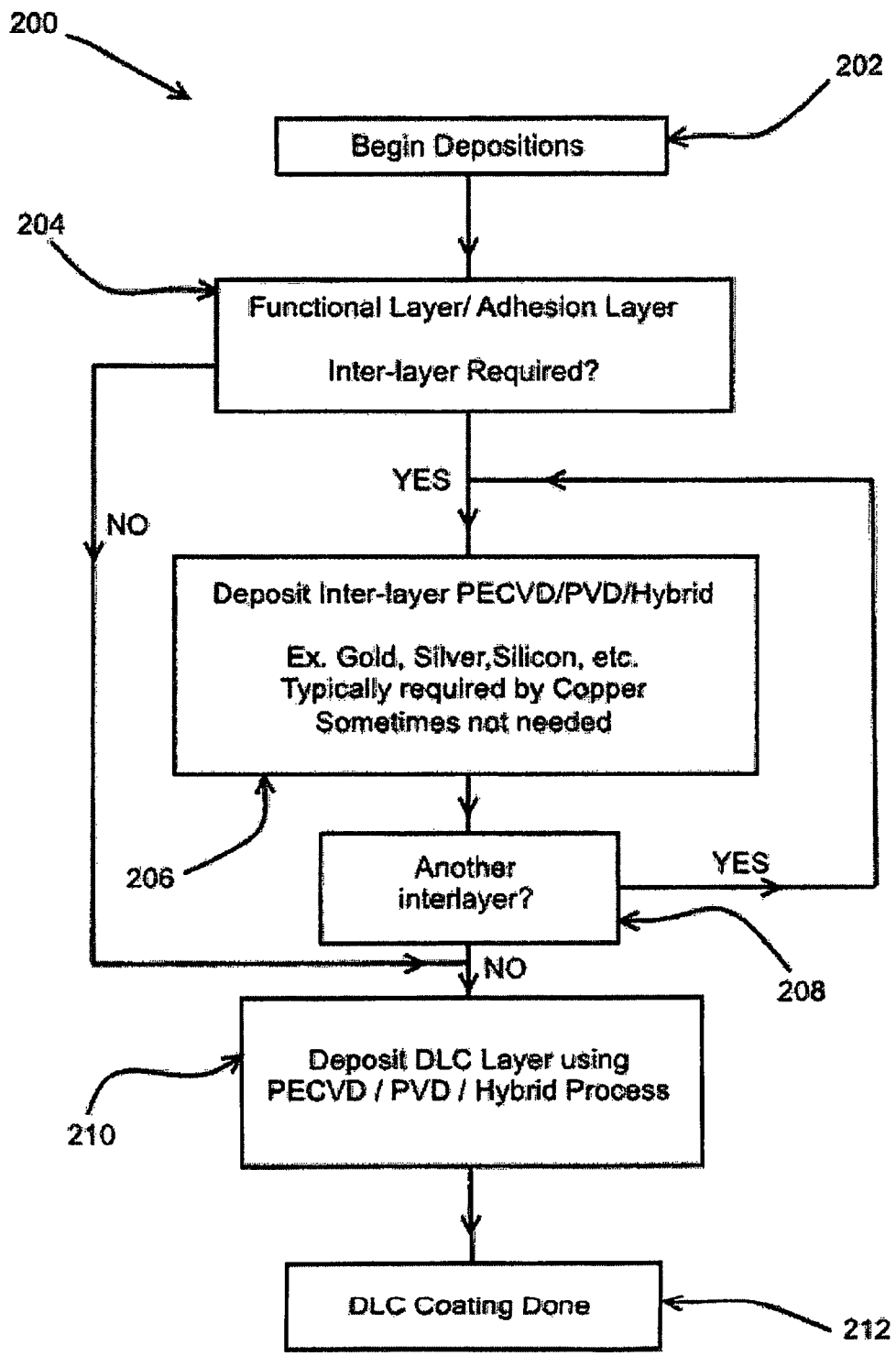
FIG. 2 is a flowchart of surface deposition steps for manufacturing a component to be coated with an enhanced multipaction resistant coating.

FIG. 2 and Flowchart 200 illustrate a flowchart of surface deposition steps for manufacturing a component to be coated with an enhanced multipaction resistant coating.

In step 202, the process of depositions is considered to begin.

In step 204, the question of is resolved as to whether one or more interlayers are required before deposition of the DLC layer. A Gold, silver, or silicon interlayer may typically be used. Copper typically requires an interlayer, sometimes it is not needed for example if high surface adhesion is not required. Multiple interlayers may be decided to be employed based on substrate materials used and desired adhesion DLC layer. Silane gas or another gas containing silicon may be used to deposit a silicon interlayer.

In step 206, if an interlayer was decided and needed, a deposition of the interlayer PECVD/PVD/Hybrid process begins, such as gold, silver, silicon, etc.

In step 208, it is determined if adding yet another interlayer is required.

In step 210, the component will then be deposited with the DLC layer using the PECVD/PVD/Hybrid process. A gas containing carbon will be used. Other optional gasses such as nitrogen or Fluorine may also be used to enhance the properties of the DLC layer. For example, Nitrogen incorporated into the layer may be used to strengthen the layer. Alternately, fluorine may be used to change the electronegativity or hydrophobicity of the surface. Complex geometries and shapes may be coated in this fashion. In step 212, the DLC coating for the component is complete.

Figure 3:
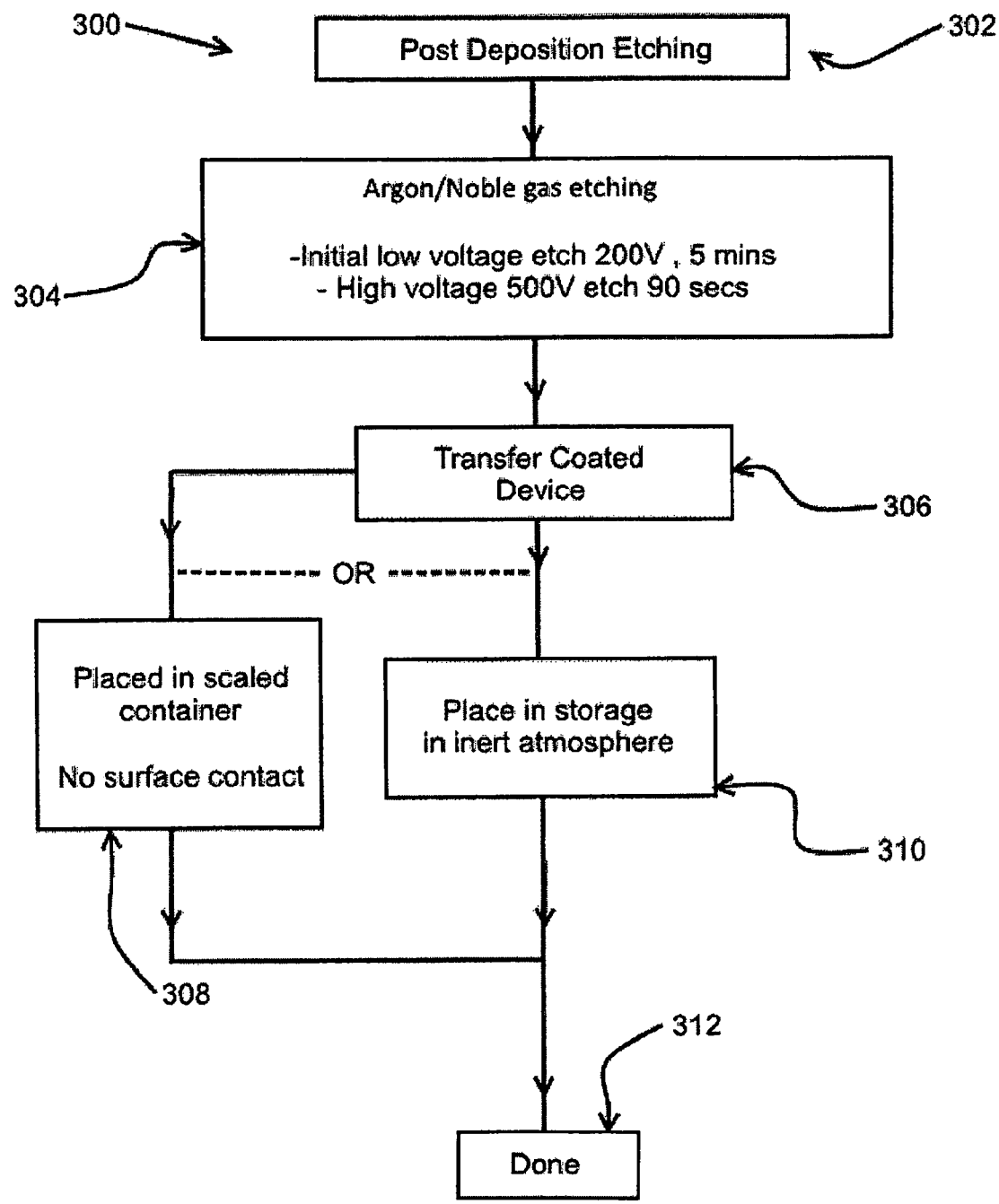
FIG. 3 a flow chart of a post deposition step for etching the coated an enhanced multipaction resistant coating.

FIG. 3 and Flowchart 300 a post deposition step for etching the coated prepared in step 2 to create an enhanced multipaction resistant coating.

In step 302, the post deposition etching for the coated component begins

In step 304, the Argon/noble gasses etching will be initiated. A two-step process has been found effective wherein using initial low voltage etch followed by a high voltage etch. For example, a 200V for 5 minutes and then a high voltage of 500V etch for 90 seconds has been shown to create a suitable etched surface with lower SEE than an unetched surface and even a surface with a SEE below 1.00 which completely eliminates multipaction.

In step 306, the coated device must then be transferred

In step 308, the component should be placed in a sealed container with no surface contact.

In step 310, the component should be placed in storage with an inert atmosphere.

In step 312, the process of creating an enhanced multipaction resistant coating is complete. A further step may be used to place a protective layer coating overtop the etched DLC coating. The protective layer may be comprised of a material that is easily removed by heating or sublimation. The material which sublimates may be naphthalene or paradichlorobenzene. As an example only, a layer of frozen CO2 gas may be placed overtop the etched DLC coating at reduced ambient temperatures. The layer of frozen CO2 gas may then sublimate into a vacuum such as a space vacuum before the coated surface is exposed to multipaction inducing conditions. In an additional embodiment protectant coating is a deposited by condensing a material in a solid state that sublimates onto the DLC coating surface. 1. An additional embodiment is maintaining the condensed material in a solid state in a state of evaporative equilibrium.

While the device and method of the present invention have been described with respect to preferred embodiments, various modifications and alterations may be made without departing from the spirit and scope of the present invention. The scope of the present invention is defined in the appended claims and equivalents thereto.

Thus, the present invention has been described in such full, clear, concise and exact terms as to enable any person skilled in the art to which it pertains to make and use the same. It will be understood that variations, modifications, equivalents and substitutions for components of the specifically described embodiments of the invention may be made by those skilled in the art without departing from the spirit and scope of the invention as set forth in the appended claims.

We claim:

1. A method of creating an enhanced multipaction resistant ("Diamond Like Carbon") DLC coating on a surface for use on a component in a multipactor flashover occurring environment, said method comprising:
   (a) preparing said surface;
   (b) coating said surface with a DLC coating layer; and
   (c) etching said DLC coating layer with an inert gas, whereby said surface resists multipaction in said multipactor flashover occurring environment, said etching comprises applying a first predetermined voltage for a first predetermined duration and a second predetermined voltage, being greater than said first predetermined voltage, for a second predetermined duration, said second predetermined duration being less than said first predetermined duration.

2. The method of claim 1 wherein said step (b) comprises coating said surface with said DLC coating layer in a presence of a combination of Nitrogen and Fluorine gases.

3. The method of claim 1 wherein said step (b) comprises coating said surface with a DLC coating layer in a presence of gases being one of a nitrogen, a fluorine, and a combination thereof.

4. The method of claim 1 wherein said step (b) comprises coating said surface with said DLC coating layer in a presence of gases that become dopants within said DLC coating layer.

5. The method of claim 1, wherein said component is a waveguide and said surface is inside a cavity within said waveguide.

6. A method of creating a surface with a multipaction resistant diamond-like carbon (DLC) coating, said method comprising:
   (a) preparing an interlayer, said interlayer having a top surface and a bottom surface;
   (b) etching said top surface with an inert gas;
   (c) coating said top surface of said interlayer with a DLC coating layer; and
   (d) etching said DLC coating layer with an inert gas to create said multipaction resistant (DLC) coating that resists multipaction in a multipactor flashover occurring environment, said etching comprises applying a first predetermined voltage for a first predetermined duration and a second predetermined voltage, being greater than said first predetermined voltage, for a second predetermined duration, said second predetermined duration being less than said first predetermined duration.

7. The method according to claim 6 wherein said step (a) comprises ultrasonic cleaning.

8. The method according to claim 6 wherein said step (a) comprises plasma etching.

9. The method according to claim 6 wherein said step (a) comprises ultrasonic cleaning and plasma etching.

10. The method according to claim 6 wherein said inert gas of each of said step (b) and said step (e) has one or more noble gases.

11. The method according to claim 6 wherein said interlayer is one of a silicon, a carbide, and a metal nitride.

12. The method according to claim 6 wherein said step (c) comprises one of PVD, PECVD, and hybrid PVD/PECVD coating processes.

13. The method according to claim 6 wherein said step (c) is performed in a presence of inert gases.

14. The method of claim 6 wherein said step (c) is performed in a presence of gases that are one of or a combination of nitrogen and Fluorine.

15. The method according to claim 6 wherein said step (c) includes additional gases that become dopants to said DLC coating layer.

16. The method according to claim 6 wherein a thickness of said DLC coating layer in said step (c) is between 0.142 nm and 200 nm.

17. The method according to claim 6 wherein said DLC coating layer is a plurality of parallel sp.2 and sp.3 hybridized carbon sheets.

18. A method of creating a surface with a multipaction resistant diamond-like carbon (DLC) coating, said method comprising:
   (a) preparing said surface;
   (b) etching said surface with an inert gas in a chamber;

(c) coating said etched surface with one or more interlayers with adhesive properties, said one or more interlayers defining a top surface;

(d) coating said top surface with a DLC coating layer in the chamber;

(e) etching said DLC coating layer with an inert gas to create said surface with said multipaction resistant DLC coating that resists multipaction in a multipactor flashover occurring environment, said etching comprises applying a first predetermined voltage for a first predetermined duration and a second predetermined voltage, being greater than said first predetermined voltage, for a second predetermined duration, said second predetermined duration being less than said first predetermined duration; and (f) coating said etched DLC coating layer with a protectant layer.

19. The method of claim 18 wherein said protectant layer in step (f) is a purified material of a composition and thickness to sublimate in a vacuum in less than 24 hours without a residue while being maintained in a solid state as a surface protectant coating.

20. The method of claim 18 wherein the coating of said etched DLC coating layer with said protectant layer in step (f) is by condensation onto the surface within a chamber that is used for said etching in step (b) and said coating in step (d).

21. The method of claim 18 wherein the protectant layer of step (f) is $CO_2$ in a solid state.

22. The method of claim 18 wherein said step (f) comprises sublimating a material into a solid state onto said etched DLC coating layer.

23. The method of claim 18 wherein said step (f) comprises sublimating a material into a solid state onto the DLC coating surface and maintaining said material, sublimated in said solid state, in a state of evaporative equilibrium.

24. A method of producing a surface with a multipaction resistant diamond-like carbon (DLC) coating, said method comprising:

providing said surface with said DLC coating; and etching said DLC coating with an inert noble gas by applying a first voltage for a first duration and applying a second voltage for a second duration, said second voltage being greater than said first voltage, said second duration being less than said first duration.

* * * * *